(12) United States Patent
Gilliland et al.

(10) Patent No.: US 6,558,995 B1
(45) Date of Patent: May 6, 2003

(54) HOLOGRAPHIC, LASER-INDUCED FABRICATION OF INDIUM NITRIDE QUANTUM WIRES AND QUANTUM DOTS

(75) Inventors: Guy D. Gilliland, Southlake, TX (US); Ming-Chang Lin, Atlanta, GA (US)

(73) Assignee: Emory University, Atlanta, GA (US)

( * ) Notice: Subject to any disclaimer, the term of this patent is extended or adjusted under 35 U.S.C. 154(b) by 0 days.

(21) Appl. No.: 09/762,038

(22) PCT Filed: Jul. 30, 1999

(86) PCT No.: PCT/US99/17391

§ 371 (c)(1),
(2), (4) Date: Apr. 27, 2001

(87) PCT Pub. No.: WO00/07221

PCT Pub. Date: Feb. 10, 2000

Related U.S. Application Data

(60) Provisional application No. 60/094,766, filed on Jul. 31, 1998.

(51) Int. Cl.[7] ............................................. H01L 21/338
(52) U.S. Cl. ........................ 438/181; 438/172; 438/483; 257/14; 257/89
(58) Field of Search ................................ 438/181, 172, 438/483; 257/14, 89

(56) References Cited

U.S. PATENT DOCUMENTS

| | | | | |
|---|---|---|---|---|
| 4,832,986 A | * | 5/1989 | Gladfelter et al. ........ 427/248.1 |
| 5,015,323 A | * | 5/1991 | Gallagher ................... 156/345 |
| 5,293,050 A | | 3/1994 | Chapple-Sokol ............. 257/17 |
| 5,583,351 A | | 12/1996 | Brown ........................ 257/89 |
| 5,675,028 A | | 10/1997 | Neumayer ..................... 552/4 |
| 5,689,603 A | * | 11/1997 | Huth .......................... 385/131 |
| 5,747,180 A | * | 5/1998 | Miller et al. ................ 428/601 |
| 5,780,355 A | | 7/1998 | Mishra ........................ 438/483 |
| 5,880,491 A | | 3/1999 | Soref .......................... 257/190 |
| 5,925,897 A | | 7/1999 | Oberman ...................... 257/80 |
| 5,962,863 A | * | 10/1999 | Russell et al. ................ 257/14 |
| 5,989,947 A | | 11/1999 | Dilger ........................ 438/172 |
| 6,011,271 A | | 1/2000 | Sakuma ....................... 257/14 |

* cited by examiner

Primary Examiner—Michael S. Lebentritt
Assistant Examiner—Pho M. Luu
(74) Attorney, Agent, or Firm—Thomas, Kayden, Horstemeyer & Risley, LLP

(57) ABSTRACT

A semiconductor device is constructed of at least one indium nitride or indium nitride alloy nanostructure on a substrate or other thing film layer. The method used to create the semiconductor device involves illuminating the substrate with a lateral intensity patterning of ultraviolet light in the presence of at least hydrazoic acid and a compound containing indium gas flows. Additionally, a semiconductor light-emitting/detecting modulating device composed of at least one indium nitride or indium nitride alloy nanostructure. The method used to create the semiconductor light-emitting/detecting modulating device involves embedding at least one nanostructure in the interior layer of the device. Further, a monolithic photovoltaic-photoelectrochemical device where one layer is composed of an indium nitride or indium nitride alloy film or nanostructure.

17 Claims, 6 Drawing Sheets

HOLOGRAPHIC, LASER-INDUCED FABRICATION OF INDIUM NITRIDE QUANTUM WIRES AND QUANTUM DOTS

This application claims priority to copending U.S. provisional application entitled, "Holographic, Laser-Induced Fabrication of Indium Nitride Quantum Wires and Quantum Dots," having Ser. No. 60/094,766, filed Jul. 31, 1998, which is entirely incorporated herein by reference.

TECHNICAL FIELD

The present invention is generally related to fabrication of semiconductors, nanostructures, photonic devices, and photoelectrolysis devices and, more particularly, is related to a method for fabricating indium nitride and indium nitride alloy quantum dots, quantum wires, and arrays of these on semiconductors or other surfaces. Additionally, the quantum dots, quantum wires, and arrays of these can be used in light emitting diodes, edge- and surface-emitting lasers, optical modulators, photodetectors, and in monolithic photovoltaic-photoelectrochemical devices.

BACKGROUND OF THE INVENTION

During the past few years there has been enormous interest in the study of the properties of wide-bandgap Group III-V semiconductors, such as InN, GaN, AlN, and their alloys and heterostructures. See for example, *J. Vac. Sci. Technol.* B 10(4), 1237 (1992). This has been motivated by the fact that these wide-bandgap semiconductors embody a class of materials suitable for opto-electronic device applications in the highly desirable visible and ultraviolet (UV) wavelength regions, and high temperature, high power and high performance electronics.

In addition, to the wide-gap semiconductors, low-dimensional semiconductor nanostructures, i.e., quantum wires (QWR) and quantum dots (QD), have also attracted much attention in recent years. Nanostructures have wide applications in electronics, optics, magnetics and superconductivity. The reason for this attention is due to theoretical predictions of fundamentally different physical properties of low-dimensional structures compared to bulk 3D or 2D quantum well structures, which may then lead to improved electronic, optical, and nonlinear optical devices based upon these low-dimensional nanostructures. Despite the theoretical predictions, the enhancements have not been generally realized due to degradation of the nanostructures. Degradation may be caused by defective interfaces, the fabrication process, and size fluctuations, which in turn cause, among other things, spurious charges, traps, broadened energy distribution, and vacancies in the nanostructures.

Many techniques used for the fabrication of QWRs and QDs suffer from some deleterious effects. All etched nanostructures, both dry and wet etched, have serious difficulties with fabrication-induced damage. Ion-implanted structures have unwanted problems with inhomogeneities as well as with implantation-induced damage. Growth on grooved substrates and cleaved-edge overgrowth techniques often yield structures with defects at the interface with the epilayer and substrate and the confining potentials are 'soft' leading to difficulty in controlling the energy levels and broadened energy distributions for the carriers. Growth of serpentine superlattices also have 'soft' confining potentials as well as inhomogeneities.

Generally in order to successfully exploit nanostructures, it is important that the particles are of the same physical size and shape. With improved consistency of particle size and shape the materials made from such particles have well defined excitonic features which in turn improves the responsiveness and efficiency of opto-electronic devices utilizing such materials.

InN has not been studied as much as GaN or AlN primarily because it has the smallest bandgap of the Group III-V nitrides and therefore has competition from other semiconductors. An important difficulty in InN growth is its poor thermal stability which limits the growth of InN by conventional high-temperature CVD processes. However, InGaN alloys have been grown of relatively good quality. The Nichia Chemical III-V nitride laser utilized InGaN/GaN quantum well structures to achieve their laser action. *Compound Semiconductor*, May/June 1996, 22. They have also recently reported the growth of an InGaN multiple quantum well laser diode grown on a spinel substrate. Nichia Chemical originally produced blue-green LEDs using InGaN/AlGaN double heterostructures, and have recently switched production to single quantum well device structures. $In_{0.2}Ga_{0.8}N$ has also been grown lattice-matched on ZnO substrates. *J Elect. Mat.* 21, 157 (1992).

Nanostructures may be used in photonic devices, specifically light-emitting diodes (LEDs) and lasers, both surface- and edge-emitting lasers. As a general proposition, an LED is a two-terminal (p-n junction), rectifying electronic device which, when forward biased, causes electrons and holes to recombine and in so doing emit light. When an LED is fabricated within a semiconductor the electrons are supplied to the p-n junction region from the n-type region and the holes are supplied from the p-type region. The energy of the emitted light (and hence its wavelength) is approximately equal to the difference in energies of the two recombining carriers. Semiconductor LEDs today are fabricated from direct gap materials. Lasers are fabricated in the same way with highly reflective surfaces to amplify the stimulated emission through oscillation. These reflective surfaces may be formed through cleaving the edges or by coating the edges or surface with a reflective coating or engineered with multiple dielectric/semiconductor layers.

Photoelectrolysis is a recently discovered process for decomposing water into $H_2$ and $O_2$ which involves photo-electrochemical processes. In the process, light is absorbed in separate, discrete semiconducting electrodes in contact with an electrolyte. The absorbed light produces electron-hole pairs within the electrodes which are subsequently separated by the semiconductor-electrolyte junctions. At the cathode and anode, electrons and holes are respectively injected into the electrolyte, thereby inducing reduction and oxidation reactions, respectively. The attractiveness of photoelectrolysis as a solar energy conversion process is that solar energy is converted into chemical energy, which can be stored more easily than either electricity or heat.

SUMMARY OF THE INVENTION

The present invention provides a method for fabricating at least one nanostucture, composed of an indium nitride based compound, on a substrate by illuminating the substrate with laterally varying intensity pattern of ultraviolet light in the presence of a gas flow consisting of at least hydrazoic acid, a compound containing indium, and possibly other gases.

Further, the present invention provides a method for fabricating, in situ, at least one indium nitride based nanostructure on a silicon substrate by illuminating the silicon substrate with a lateral patterning of ultraviolet light in the presence of at least hydrazoic acid and trimethylindium gas flows.

Furthermore, the present invention includes a nanostructure made of at least one nanostructure on a substrate that may be composed of an indium nitride based compound.

The present invention can also be viewed as providing a method for fabricating a semiconductor light-emitting/detecting device. The fabrication includes forming at least one nanostructure of second conductivity-type on a first layer of first conductivity type. Then a second layer of second conductivity-type is formed over the first layer of first conductivity type so as to embed the nanostructure(s) in the second layer of second conductivity type. Finally, a third layer of first conductivity type is formed over the second layer of second conductivity type. In other words, a layer with embedded nanostructures is in-between two layers which are of opposite conductivity type as the middle layer. The first, second, and third layers may be composed of the same material except that the first and third layers are of opposite conductivity type as the second layer.

In addition, the present invention provides a new semiconductor light-emitting/detecting device. The device includes at least one nanostructure of the second conductivity-type on a first layer of first conductivity type. A second layer of second conductivity-type is over the first layer of first conductivity type so as to embed the nanostructure(s) in the second layer of second conductivity type. Finally, a third layer of first conductivity type is over the second layer of second conductivity type. In other words, a layer with embedded nanostructures is in-between two layers which are of opposite conductivity type as the middle layer.

The present invention can also be viewed as providing a new monolithic photovoltaic-photoelectrochemical device. The device includes a top portion of an appropriately doped p-type semiconductor connected to a second portion of an appropriately doped n-type semiconductor by a diode interconnect. The third portion of an appropriately doped p-type semiconductor is electrically connected to the second portion. An ohmic contact is electrically connected to the third portion and also electrically connected to a metallic electrode or more specifically a platinum electrode.

Other features and advantages of the present invention will become apparent to one skilled in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1A is at a time equal to zero; FIG. 1B is at time longer than that in FIG. 1A but at a time shorter than FIG. 1C; and FIG. 1C is at a time longer than both FIG. 1A and FIG. 1B.

FIG. 1L is at a time equal to zero; FIG. 1M is at time longer than that in FIG. 1L but at a time shorter than FIG. 1N; and FIG. 1N is at a time longer than both FIG. 1L and FIG. 1M.

DETAILED DESCRIPTION OF THE PREFERRED EMBODIMENT

Figure 1A:
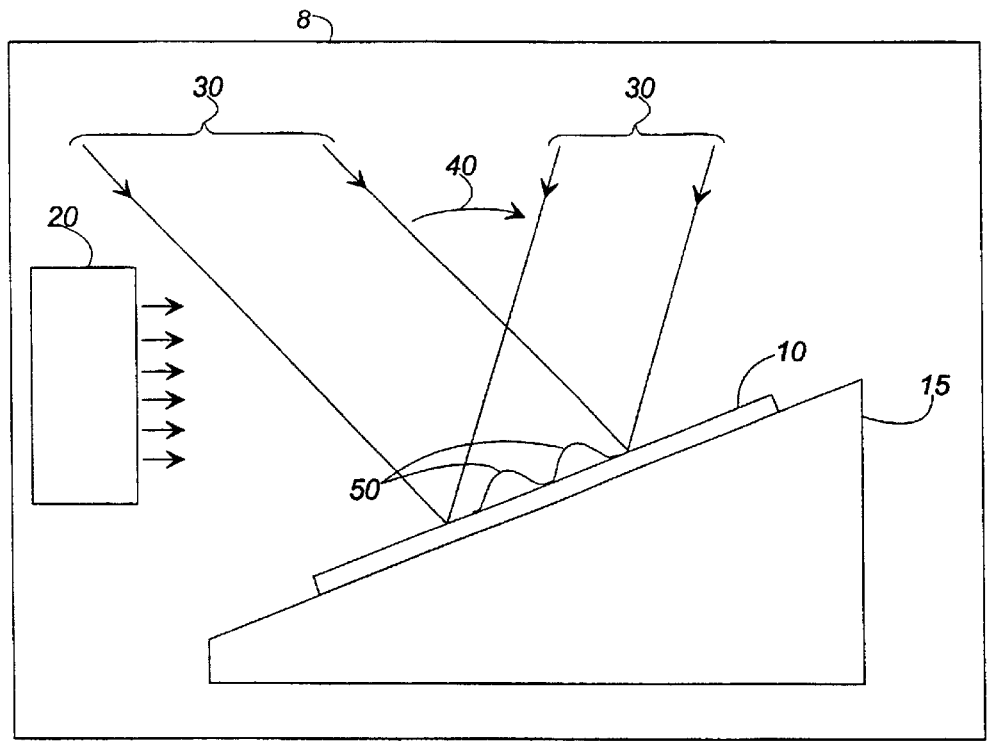
FIGS. 1A–1C are diagrams of side views of which collectively illustrate the growth of the quantum wires on a substrate at sequentially longer time periods in accordance with the nanostructure fabrication method of the present invention.

All patents, patent applications and literature references cited in this document are hereby incorporated by reference in their entirety. In the case of inconsistencies, the present disclosure, including, definitions, will prevail.

This invention involves the marriage of three distinct, but known fields: nanostructures and quantum mechanics, material growth and eqitaxy, and lasers and optics. Nanostructures include quantum structures such as quantum wells, quantum wires, quantum dots, and arrays of these. Standard techniques can be used to grow these materials. FIGS. 1A–1C and 1L–1N are schematics describing material growth techniques that can represent, but are not limited to, the following techniques: Chemical Vapor Deposition (CVD), Metal-Organic-Chemical-Vapor-Deposition (MOCVD), Organo-Metallic-Vapor-Phase-Epitaxy (OMVPE), Low Pressure (LP) OMVPE deposition, Molecular Beam Epitaxy (MBE), or other epitaxial techniques. The material growth is aided by ultraviolet (UV) light from a UV light source such as a laser and is made to have a laterally varying intensity distribution (lateral intensity patterning) which can be created by, but not limited to, the following techniques: holographic techniques and phase-shift techniques. The most common source of UV light are lasers. Examples of lasers are, but not limited to, excimer, semiconductor, gas, solid state, liquid, chemical, and free electron lasers.

In thin film structures or two-dimensional quantum well structures, the dimensions may be close to or less than the de Broglie wavelength of a conduction electron or valence hole. The super thin film structure may be fabricated by depositing different types of semiconducting thin-film materials in alternation, various physical properties that have not been seen in bulk semiconductors have been found. In a two-dimensional quantum well structure, a carrier that is an electron or a hole has two degrees of freedom. In a one-dimensional quantum well structure (generally called a quantum wire) and a zero-dimensional quantum well structure (generally called a quantum dot), the carrier has one and zero degrees of freedom, respectively.

A quantum wire is a cluster of atoms whose dimensions in two directions are close to or less than the quantum mechanical wavelength of an electron or a "hole". Similarly, a quantum dot is a cluster of atoms whose dimensions in all directions are close to or less than the quantum mechanical wavelength of an electron or a "hole". See, *Phys. Rev. B*, Vol. 52, 12212 (1995) and *Z. Phys. Rev. B*, Vol. 85, 317 (1991), *Quantum Semiconductor Structures: Fundamentals and Applications* by C. Weisbuch and B. Vinter, all of which are incorporated herein by reference.

Nanostructures can be used singularly, in arrays of dots or wires or in mixed arrays of dots and wires. Additionally, nanostructures can be used as discrete components or as part of an integrated system. In some cases if may be desireable to produce nanostructures that are sufficiently close together so that they are coupled by quantum mechanical tunneling. Such arrays have potential applications as photodetectors, lasers and single electron transistors.

Holography is a technique whereby multiple beams of coherent light interfere with one another constructively and destructively. The critical aspect of this technique is the coherence of the light waves. Incoherent light or coherent light that is "beyond the coherence length" of the other beam(s) of light will not interfere due to the vanishing "cross-terms" in the electromagnetic (EM) field equations. However, when multiple beams of coherent light are spatially superimposed on one another these cross terms in the electromagnetic field equations appear and may even dominate the resulting field intensity. The result is a spatially-varying modulated field lateral intensity that may be controlled by altering the geometry of the beams and/or the characteristics of the coherent laser light (e.g., wavelength, coherence length, etc.). Phase-shift techniques operate by phase-shifting one or more coherent laser beams relative to a reference laser beam to achieve a spatially-varying modulated field lateral laser intensity. The geometric shapes of the quantum wires and dots may be regular polyhedrons or irregular shapes.

FIGS. 1A–1C and 1L–1M are two sequences of diagrams that illustrate the growth of nanostructures that can include quantum dots, quantum wires, arrays of quantum dots, arrays of quantum wires, and arrays of a mixture of quantum dots and wires. The quantum dots, quantum wires, arrays of quantum dots, arrays of quantum wires, and arrays of a mixture of quantum dots and wires can be used as discrete components or as part of an integrated system. Additionally, the nanostructures in the FIGS. 1A–1M, FIGS. 2A–2B, and FIGS. 3A–3B are represented as simple polyhedrons merely for clarity. The physical and geometric details can be controlled by the particular holographic technique and many shapes can be created. The foregoing definition and description of nanostructures is intended to be used throughout this entire document.

Figure 1B:
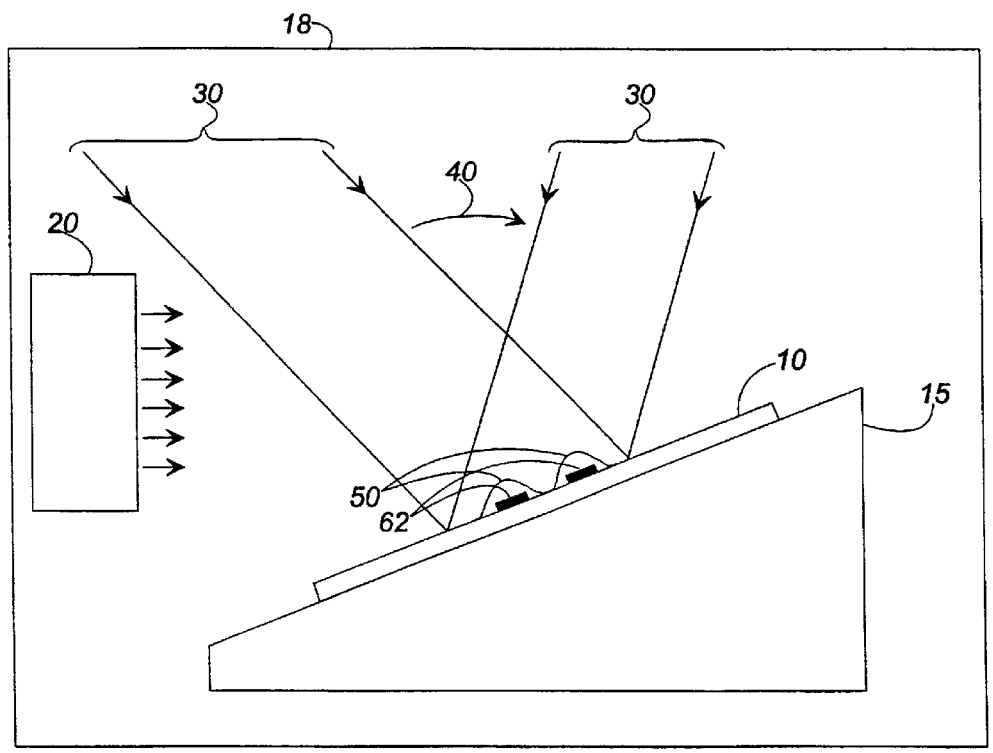
Figure 1C:
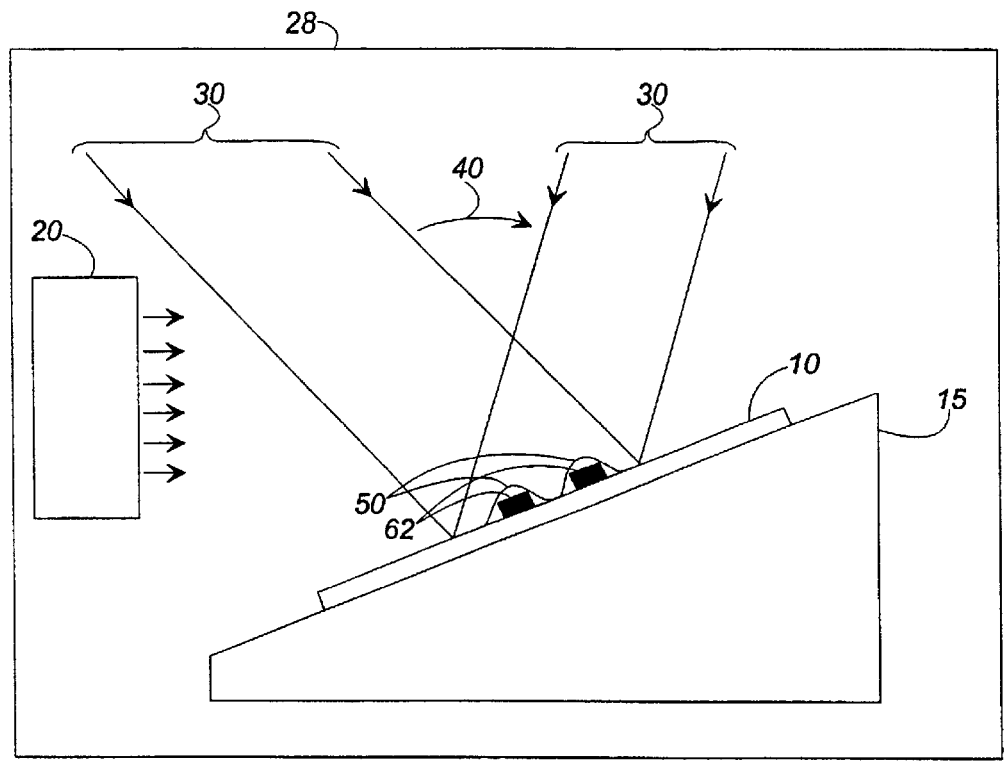

FIG. 1A illustrates a generic material growth apparatus diagram 8 at a time equal to zero, where no growth has occurred. FIG. 1B illustrates a generic material growth apparatus diagram 18 at a some later time than that of generic material growth apparatus diagram 8, where quantum wire growth has occurred. FIG. 1C illustrates a generic material growth apparatus diagram 28 at some later time than that of generic material growth apparatus diagrams 8 and 18, where subsequent quantum wire growth has occurred relative to generic material growth apparatus diagram 18.

Figure 1L:
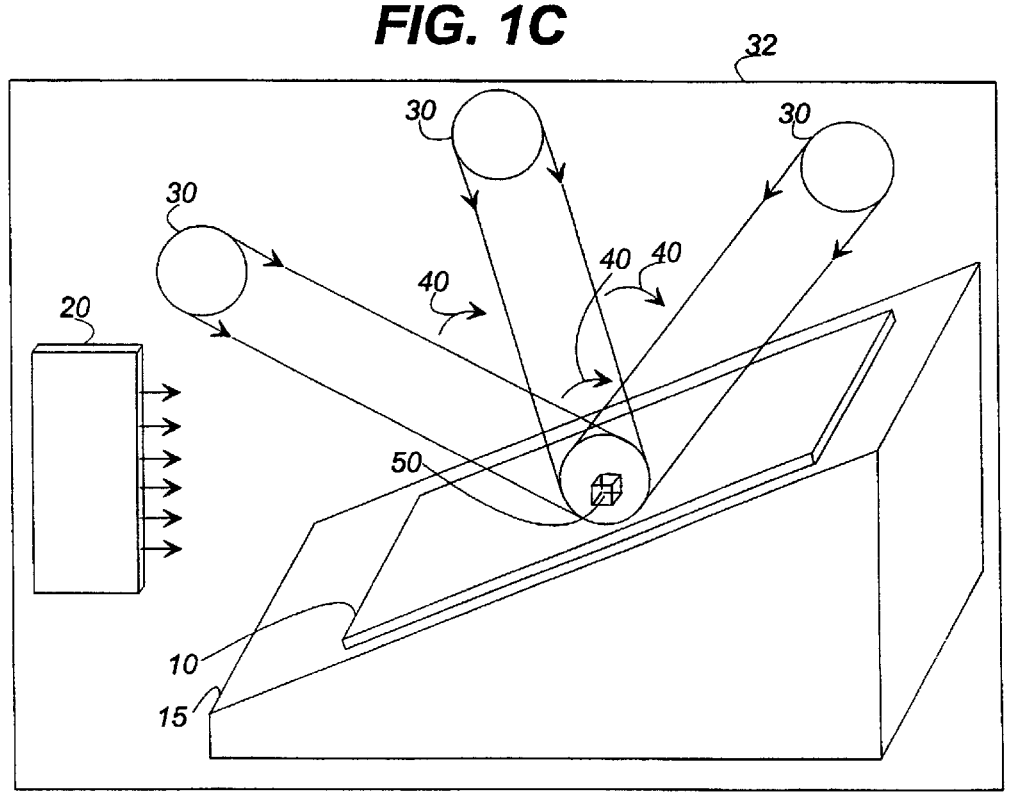
FIGS. 1L–1N are diagrams of a side view of which illustrates the growth of a quantum dot on a substrate at sequentially longer time periods in accordance with the nanostructure fabrication method of the present invention.
Figure 1M:
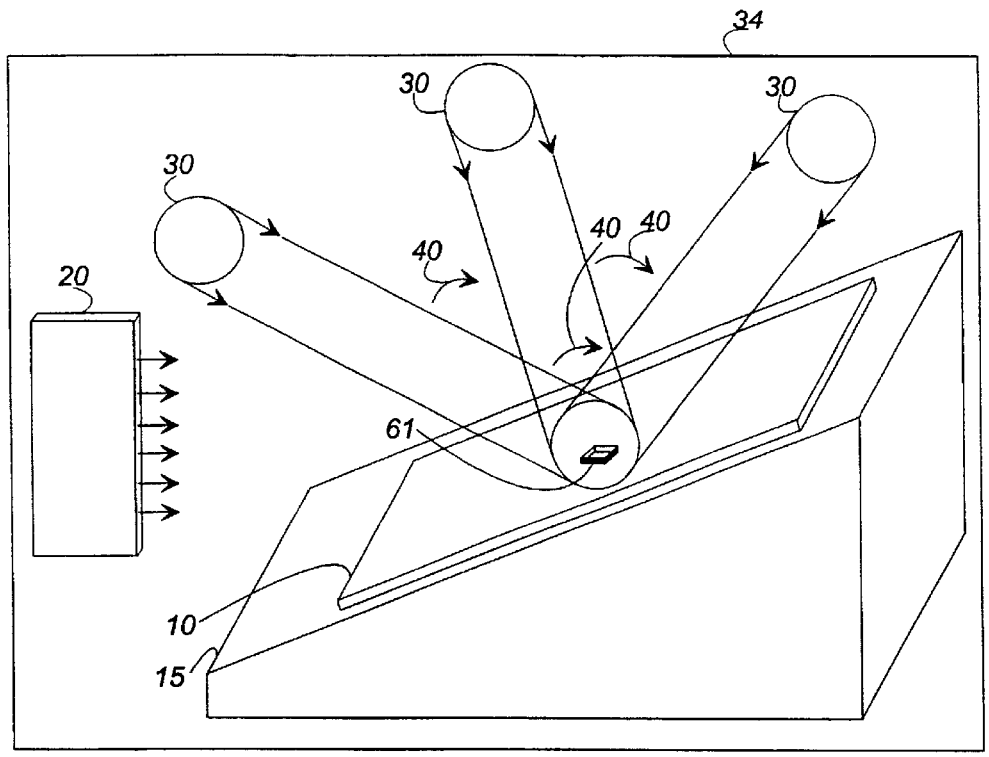
Figure 1N:
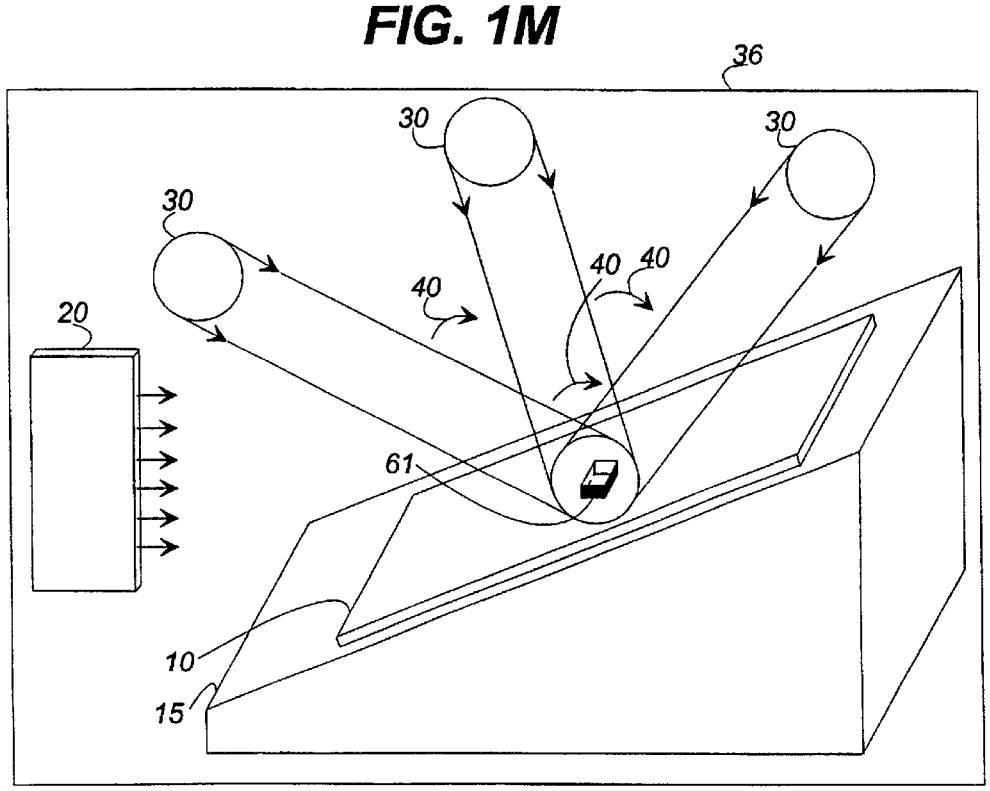

FIG. 1L illustrates a generic material growth apparatus diagram 32 at a time equal to zero, where no growth has occurred. FIG. 1M illustrates a generic material growth apparatus diagram 34 at a some later time than that of generic material growth apparatus diagram 32, where quantum dot growth has occurred. FIG. 1N illustrates a generic material growth apparatus diagram 36 at some later time than that of generic material growth apparatus diagrams 32 and 34, where subsequent quantum dot growth has occurred relative to generic material growth apparatus diagram 34.

Figure 2A:
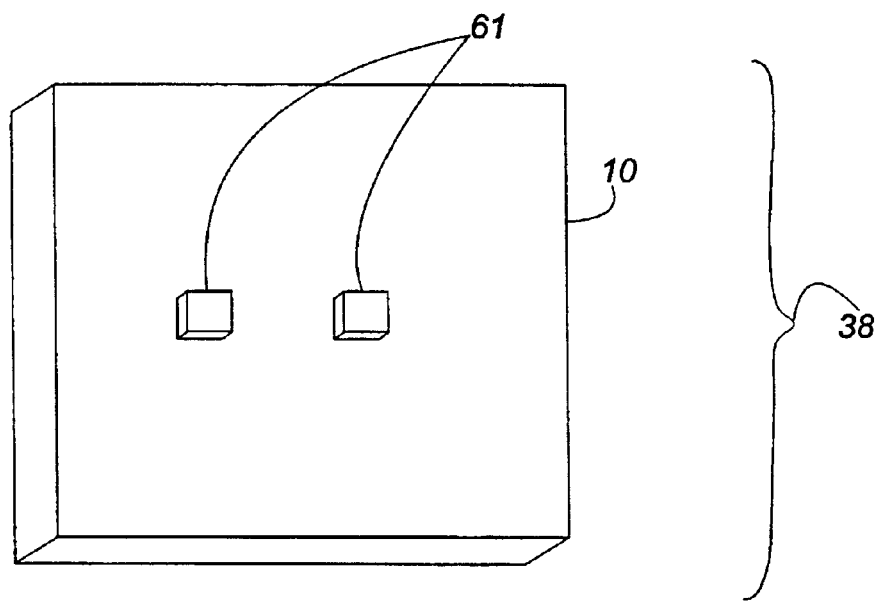
FIGS. 2A–2B are diagrams of a top view of which illustrate grown quantum dots (FIG. 2A) and quantum wires (FIG. 2B) on a substrate.
Figure 2B:
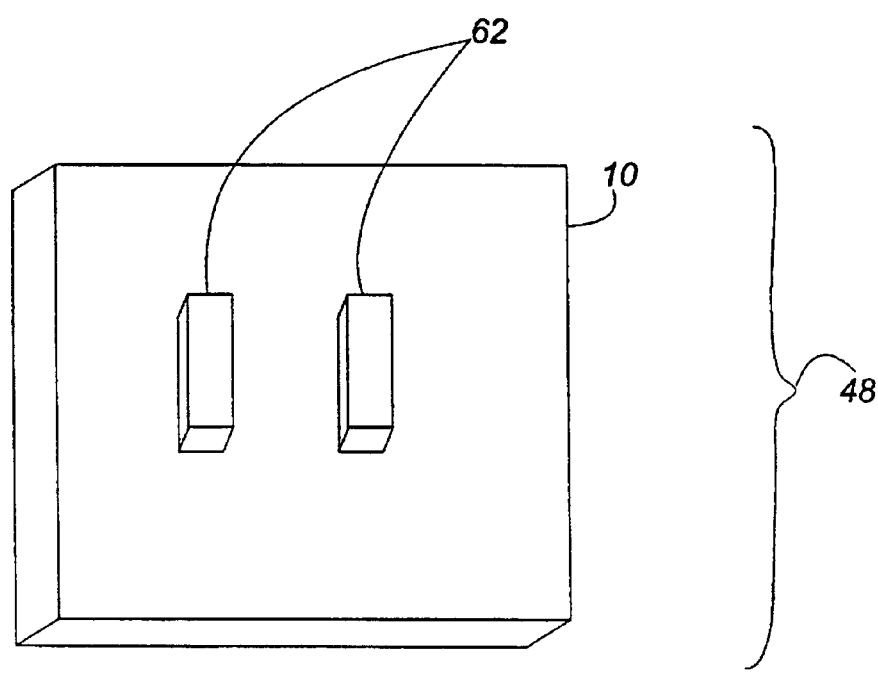

FIG. 2A illustrates a top view of a substrate-quantum dot structure 38. FIG. 2B illustrates a top view of a substrate-quantum wire structure 48.

The method of growing nanostructures is generally illustrated in FIGS. 1A–1C, 1L–1N, and 2A–2B. FIG. 1A and 1L shows a substrate 10 setting on a heat source 15. Examples of the substrate are, but not limited to, silicon (Si), gallium arsenide (GaAs), a-plane aluminum oxide ($Al_2O_3$), c-plane $Al_2O_3$, silicon carbide (SiC), zinc oxide (ZnO), titanium dioxide ($TiO_2$) and each of their polytypes. The heat source 15 heats up the substrate 10 to 300–1500 Kelvin. Gases 20 are flowed over the substrate 10. Examples of gases are, but not limited to, trimethylindium, triethylindium, other indium containing metallo-organic precursors, hydrazoic acid, or other nitrogen containing compounds. Carrier gases, such as $N_2$, as well as other constituent gases may be present. A beam of ultraviolet (UV), pulsed or continuous wave, light (coherent and in some cases incoherent) is split into two or more nearly equivalent UV beams 30. The UV beams 30 are directed onto the substrate 10 at some angle, θ, 40. As shown in FIGS. 1A–1C the UV beams 30 are in the same plane in contrast to FIGS. 1L–1N where the UV beams 30 are non-planar. The angles 30 in FIGS. 1L–1N are the angle between the respective beams in the particular reference planes. The UV light 30 recombines to yield a sinusoidially varying modulated field lateral UV beam intensity, hereinafter termed lateral intensity patterning 50. In FIG. 1L the lateral intensity patterning 50 is shown as a cube rather than in a sinusoidal form as it is shown in FIGS. 1A–1C. Additionally, in FIGS. 1M–1N the lateral intensity patterning 50 is omitted for clarity. The lateral intensity patterning 50 yields a laterally-modulated growth profile pattern of quantum wires 62 in FIGS. 1B–1C and a quantum dot 61 in FIGS. 1M–1N (generally referred to as nanostructures 61 and 62), where the growth corresponds with the UV light intensity 30 of the lateral intensity patterning 50. Nanostructures 61 and 62 may be regular simple polyhedrons or may be irregular shapes. FIG. 2A illustrates a top view of two quantum dots 61 grown by the method illustrated in FIGS. 1A–1C. FIG. 2B illustrates a top view of two quantum wires 62.grown by the method illustrated in FIGS. 1A–1C. The fabrication of the nanostructures 61 and 62 is performed in situ.

The invention provides many advances in the art due to the composition of the nanoparticles 61 and 62 as well as the nanoparticle fabrication technique. The composition of the nanostructures 61 and 62 for this invention include, but are not limited to, Group III-V nitrides and more specifically indium nitride based compounds, indium nitride (InN), indium nitride alloys, indium gallium nitride ($In_xGa_{1-x}N$) and indium aluminum nitride ($In_xAl_{1-x}N$). Group III-V nitrides are mechanically hard and chemically inert. The fabrication techniques presented in this invention may be more economical than other approaches that require post-growth processing or e-beam lithography. Further, the growth of Group III-V nitrides can be done on a technologically-important substrate, Si, which may allow integration with other electronic devices.

One advantage of these fabrication techniques is that they are done in situ, which thereby eliminates nonradiative recombination and dead or depletion layer effects common in other fabrication techniques. These include processes that employ a beam (electron beam, ion beam or x-ray) to delineate nanostructures 61 and 62. It is well-known, however, that such conventional techniques can cause significant damage to processed nanostructures 61 and 62. Damage is incurred in two stages: during the delineation step when the material is exposed to relatively high energy electron beam, ion beam or x-ray and during post processing (such as reactive ion etching) when the delineated patterns are etched to produce the final nanostructures 61 and 62, and or during the etching step, which is usually carried out in the presence of reactive ions, the nanostructures 61 and 62 are subjected to corrosive ions and radiation which can cause extensive material damage.

The types of damage described above may introduce a host of spurious charges, traps, and vacancies, in the nanostructures 61 and 62. The spurious charges can have a disastrous effect in many electronic applications and traps (non-radiative recombination centers) can be a serious problem in optical applications. Additionally, surface states may pin the Fermi level in a semiconductor quantum dot in the middle of the energy gap and completely deplete a structure of mobile carriers. In short, process related damages are a serious issue in nanosynthesis.

The techniques used in this invention reduce defects and dislocations. These fabrication techniques are conceptually simple and may be accomplished in a single growth step, requiring no post-growth processing. Reduced defect and dislocation density implies lower threshold current density for devices using these nanostructures 61 and 62. Also, reduced defect and dislocation densities result in higher optical efficiency in devices fabricated using these nanostructures 61 and 62.

In order to successfully exploit nanostructures 61 and 62, the particles should be approximately of the same physical size and shape. With improved consistency of particle size and shape the materials made from such particles have well defined excitonic features and quantum mechanical energy effects, which in turn improves the responsiveness and efficiency of opto-electronic devices utilizing such materials. In some cases it may be desirable to produce nanostructure arrays 61 and 62 that are sufficiently close together that they are coupled by quantum mechanical tunneling. Such arrays have potential applications as photodetectors, lasers and single electron transistors. Highly controlled growth and lateral intensity patterning 50 can be achieved using these UV light 30 sources to produce various shapes and arrays of nanostructure patterns 61 and 62.

Furthermore, UV light 30 enhances the reactivity of the substrate 10 and induces nitride growth. For example, trimethylindium 20 adsorbs to the silicon substrate 10 at temperatures at 110 Kelvin with partial breaking of methyl, $CH_3$, bonds. However, above 520 Kelvin $CH_3$ bond breaking is complete, but with residual $CH_3$ radicals remaining on the silicon substrate 10 surface. The UV light 30 enhances $CH_x$, radical desorption, so after illumination with UV light 30 no residual $CH_x$, species are detected on the silicon substrate 10 surface. Also, the UV light 30 removes silicon hydride ($SiH_x$) species effectively from the silicon substrate 10 at temperatures of 300–700 Kelvin. The removal of H atoms from the silicon substrate 10 creates more active sites for surface reactions. Additionally, the UV light 30 photodissociates hydrazoic acid ($HN_3$) 20 into effective N-species for nitradation and nitride growth.

Lower temperature depositions can be performed when hydrazoic acid 20 is used as the nitrogen precursor. Using the lower temperature deposition decreases H-incorporation into the substrate 10, which may cause difficulties in producing some Group III-V nitrides. In addition, there is a significant mismatch in the thermal expansion coefficients of the Group III-V nitrides and common substrates 10 for Group III-V growth. As a result of this mismatch, low-temperature growth is advantageous for heteroepitaxial growth. Further, low-temperature deposition assists in the growth of indium nitride and indium nitride alloys.

These nanostructures 61 and 62 may be used for many applications. Photonic devices can use these nanostructures 61 and 62 to generate, amplify, detect, propagate, transmit, modify, or modulate light. Nanostructures 61 and 62 may constitute a discrete component or be part of an integrated system. More specifically, light-emitting materials in the UV to yellow portions of the visible spectrum may be composed of nanostructures 61 and 62. Light-emitting structures include, but are not limited to, laser diodes, diode laser arrays, vertical cavity surface emitting lasers and light emitting devices. A few examples of light-emitting structures are the following: displays, lasers, and light-emitting-diodes (LEDs). In addition, light-emitting materials and structures for high-temperature and high-power applications can use these nanostructures 61 and 62. Electro-optical devices, such as modulators or photodetectors, operating in the UV to yellow portions of the visible spectrum can use these nanostructures 61 and 62. Finally, these nanostructures 61 and 62 can be used in monolithic photoelectrochemical/photovoltaic (PEC/PV) devices.

Nanostructures 61 and 62 can be used in LEDs. As a general proposition, a LED is a two-terminal (p-n junction), rectifying electronic device which, when forward biased, causes electrons and holes to recombine and in so doing emit light. When the LED is fabricated within a semiconductor the electrons are supplied to the p-n junction region from the n-type region and the holes are supplied from the p-type region. The energy of the emitted light (and hence its wavelength) is equal to the difference in energies of the two recombining carriers. For semiconductors, the energy difference is usually very nearly equal to the band gap energy. There are two types of band gap materials: direct and indirect band gap materials. For many semiconductors, the band gap is "direct" which means that the electron and hole can recombine by simply emitting a photon to carry off the energy difference. For other semiconductors the band gap is "indirect" which means that a phonon or lattice vibration must be excited in the process of light emission. The consequence is that indirect gap materials are a thousand to more than a million times less efficient at light emission (i.e., less light and more heat are emitted from the electron-hole recombination) than direct gap materials. For this reason, the predominant solid state LEDs seen today are fabricated from direct gap materials.

Figure 3A:
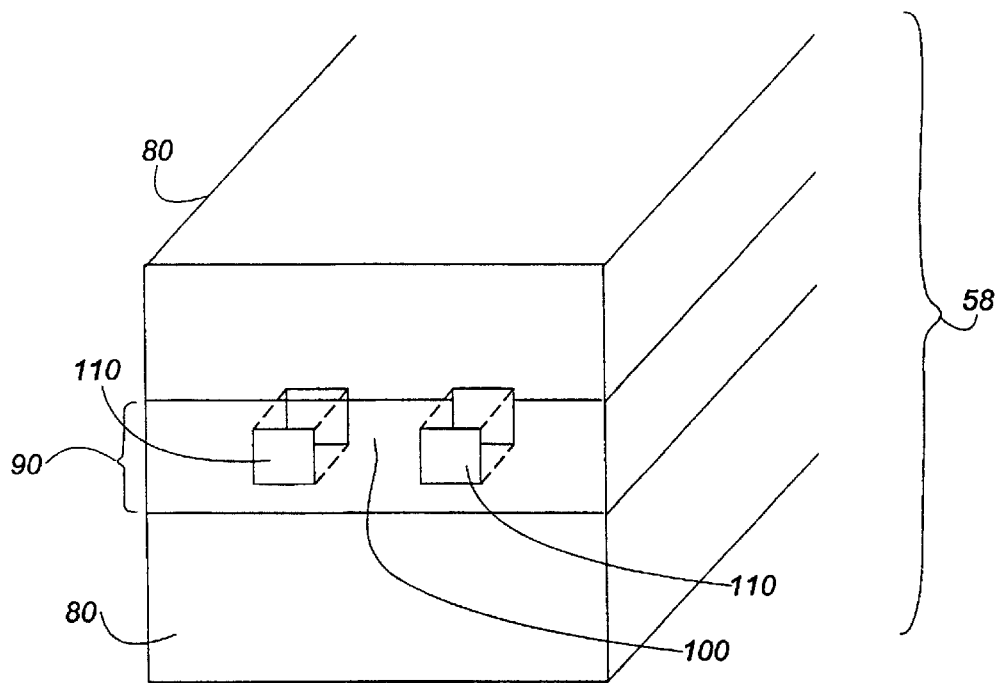
FIGS. 3A–3B are diagrams of a cross sectional side view of a light-emitting diode structure, laser structure or photodiode structure with embedded quantum dots (FIG. 3A) and quantum wires (FIG. 3B).
Figure 3B:
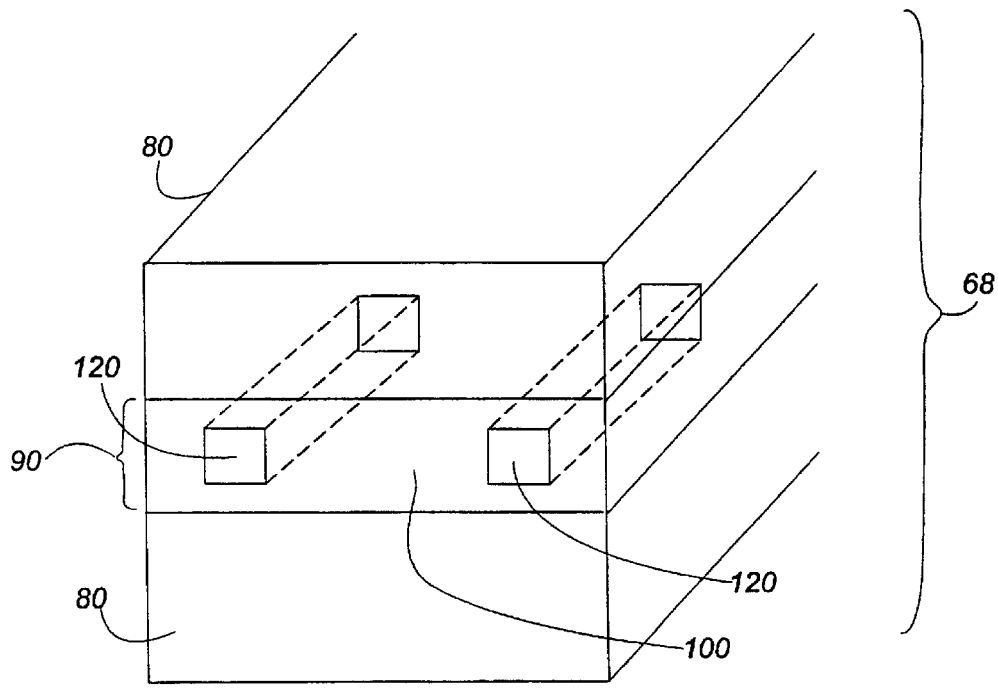

FIGS. 3A–3B are diagrams of cross-sections of LEDs with nanostructures 61 and 62. FIG. 3A illustrates a cross-section of a LED-quantum wire structure 58. FIG. 3B illustrates a cross-section of a LED-quantum dot structure 68. The first layer 80 and third layer 80 are made of a layer composed of, at least partially, silicon 100 or aluminum nitride 100 of n-type or p-type. The first layer 80 and third layer 80 are connected by a second layer 90. The second layer 90 is made of silicon layer 100 or aluminum nitride layer 100 of n-type or p-type and is embedded with nanostructures 61 and 62 of n-type or p-type. The first layer 80 and third layer 80 are always of the opposite type as the second layer 90. FIG. 3A illustrates an LED where the second layer 90 is embedded with quantum dots 110. FIG. 3B illustrates an LED where the second layer 90 is embedded with quantum wires 120. The quantum dots 110 and quantum wires 120 are of the same type as the second layer 90.

The LED is fabricated by forming quantum dots 110 and/or quantum wires 120 on a first layer 80. The first layer 80 may be a silicon layer 100 or aluminum nitride layer 100 of n-type or p-type. The quantum dots 110 and/or quantum wires 120 may be made up of an n-type or p-type indium nitride alloy, but are of the opposite type as the first layer 80. A second layer 90 is formed by placing a second layer 90, which is composed of the same material as the first layer 80, of opposite type over the first layer 80 so as to embed the quantum dots 110 and/or quantum wires 120. The second layer 100 and the embedded quantum dots 110 and/or quantum wires 120 are of the same type. A third layer 80, identical to the first layer 80, is placed over the second layer 90. In other words, a layer of embedded quantum dots 110 and/or quantum wires 120 is in-between or sandwiched between the first 80 and third layer 80. The first 80 and third layers 80 are of the same type, but of opposite type of the second layer 90. For example, p-n-p LED is made of a first 80 and second layers 80 of p-type, while the second layers 90 with the embedded quantum dots 110 and/or quantum wires 120 is of n-type.

The embedded quantum dots 110 and/or quantum wires 120 are at least one quantum dot 110 or at least one quantum wire 120. In addition, the embedded quantum dots 110 and/or quantum wires 120 may be configured as arrays of quantum dots 110, arrays of quantum wires 120, or arrays of a mixture of quantum dots 110 and quantum wires 120. The embedded quantum dots 110 and/or quantum wires 120 may be made of an indium nitride alloy or more specifically $In_xGa_{1-x}N$ or $In_xAl_{1-x}N$. The first, second, and third layers may be composed of doped silicon layer, undoped silicon layer, doped aluminum nitride layer, undoped aluminum nitride layer, doped silicon carbide (SiC) layer, and undoped SiC layer Photoelectrolysis is a recently discovered process for decomposing water into $H_2$ and $O_2$ which involves a photoelectrochemical processes. In the process, light is absorbed in separate, discrete semiconducting electrodes in contact with electrolyte. The absorbed light produces electron-hole pairs within the electrodes which are subsequently separated by the semiconductor-electrolyte junctions. At the cathode and anode, electrons and holes are-respectively injected into the electrolyte, thereby inducing reduction and oxidation reactions, respectively. Hence, an overall photochemical reaction is achieved in two steps: (1) electrons and holes are first created by photo-excitation of semiconducting electrodes, and (2) the electrons and holes drive chemical reactions in an electrochemical cell. This sequence can drive reactions at more favorable energies than can either direct photolysis or electrolysis acting independently. The attractiveness of photoelectrolysis as a solar energy conversion process is that solar energy is converted into chemical energy, which can be stored more easily than either electricity or heat.

Figure 4:
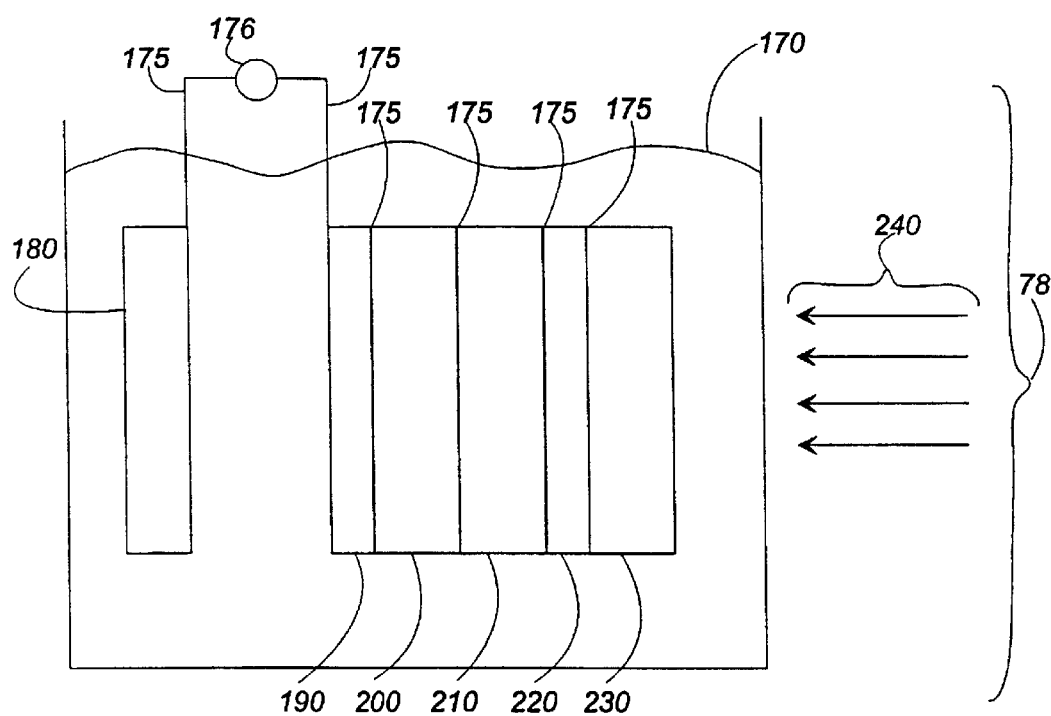
FIG. 4 is a diagram of a monolithic photovoltaic-photoelectrochemical device (PV/PVC) of the present invention.

FIG. 4 illustrates a general photoelectrolysis apparatus 78. More specifically, FIG. 4 illustrates a photovoltaic-photoelectrochemical device (PEC/PV) in an aqueous solution 170. A metallic, and more specifically platinum, electrode 180 is electrically connected 175 to a current source 176 which is electrically connected 175 to an ohmic contact 190. The ohmic contact 190 is electrically connected 175 to a p-GaAs or p-Si substrate or portion 200. The p-GaAs or p-Si substrate 200 is electrically connected 175 to a n-GaAs or n-Si substrate 210. The bottom p-n junction is made up of a p-GaAs or p-Si substrate 200 and a n-GaAs or n-Si substrate 210. The bottom p-n junction is connected to a diode interconnect 220 (e.g. a tunnel diode interconnect), which is connected to a p-InN, p-$In_xGa_{1-x}N$ or p-$In_xAl_{1-x}N$ substrate 230. The top p-n junction is made up of a n-GaAs or n-Si substrate 210 and a p-InN, p-$In_xGa_{1-x}N$ or p-$In_xAl_{1-x}N$ substrate 230. The electrical connection can be made using a wire, cable, clip, fastener, or other surface of appropriately conducting material.

For example, light incident 240 on the PECIPV configuration first enters the top wide band gap p-InN, p-$In_xGa_{1-x}N$, or p-$In_xAl_{1-x}N$ substrate 230, in which the more energetic photons are absorbed, resulting in electron-hole pair excitation and producing photovoltage. Less energetic photons incident upon the configuration penetrate through the top substrate 230 and are absorbed by a GaAs or Si bottom p-n junction 210 and 200 generating photovoltage. One set of holes and electrons are recombined at the tunnel junction. If the generated photovoltage is greater than that which is required for photoelectrolysis for the particular cell configuration, it will drive the water reduction at the semiconductor electrode and water oxidation at the counterelectrode. *Science*, Vol. 280, 425, which is incorporated herein by reference.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments(s) of the invention without departing substantially from the spirit and principles of the invention. All such modifications and variations are intended to be included herein within the scope of the present invention and protected by the following claims.

Therefore, having thus described the invention, at least the following is claimed:

1. A method of fabricating nanostructures, comprising the steps of:

providing a substrate;

introducing hydrazoic acid ($HN_3$) and a compound containing indium with said substrate;

illuminating said substrate with a lateral intensity patterning of ultraviolet (UV) light; and forming at least one nanostructure on said substrate.

2. The method of claim 1, wherein said at least one nanostructure is selected from the group consisting of quantum dots, quantum wires, arrays of quantum dots, arrays of quantum wires, and arrays of a mixture of quantum dots and wires.

3. The method of claim 1, wherein said compound containing indium is selected from the group consisting of trimethylindium, triethylindium, or other indium containing metallo-organic precursors.

4. The method of claim 1, wherein said compound containing indium comprises trimethylindium.

5. The method of claim 1, wherein said lateral intensity patterning of said substrate is performed by techniques selected from the group consisting of holographic techniques using coherent UV laser light and phase shift techniques using coherent UV laser light.

6. The method of claim 1, wherein said at least one nanostructure is made of an indium nitride based compound.

7. The method of claim 6, wherein said indium nitride based compound comprises an indium nitride alloy.

8. The method of claim 7, wherein said indium nitride alloy is selected from the group consisting of $In_xGa_{1-x}N$ and $In_xAl_{1-x}N$.

9. The method of claim 1, wherein said indium nitride based compound is grown in situ.

10. The method of claim 1, wherein said substrate is selected from the group consisting of Si, GaAs, a-plane $Al_2O_3$, c-plane $Al_2O_3$, SiC, ZnO, $TiO_2$, GaAs, and their polytypes.

11. A method of in situ fabrication of a indium nitride based nanostructure, comprising the steps of:

providing a silicon substrate;

introducing hydrazoic acid (HN$_3$) and a compound containing indium to said substrate;

illuminating said silicon substrate with a lateral intensity patterning of ultraviolet (UV) light; and forming at least one indium nitride based nanostructure on said silicon substrate.

12. The method of claim 11, wherein said at least one nanostructure is selected from the group consisting of quantum dots, quantum wires, arrays of quantum dots, arrays of quantum wires, and arrays of a mixture of quantum dots and wires.

13. The method of claim 11, wherein said indium nitride based compound comprises an indium nitride alloy.

14. The method of claim 11, wherein said indium nitride based alloy is selected from the group consisting of In$_x$Ga$_{1-x}$N and In$_x$Al$_{1-x}$N.

15. The method of claim 11, wherein said lateral intensity patterning of said substrate is performed by techniques selected from the group consisting of holographic techniques using coherent UV laser light and phase shift techniques using coherent UV laser light.

16. A method of fabricating nanostuctures, comprising the steps of:

providing a substrate;

introducing a hydrazoic acid (HN$_3$) gas and a gas including a compound containing indium to said substrate;

illuminating said substrate with a lateral intensity patterning of ultraviolet (UV) light; and forming at least one indium nitride based nanostructure on said substrate.

17. A method of in situ fabrication of an indium nitride based nanostructure, comprising the steps of:

providing a silicon substrate;

introducing a hydrazoic acid (HN$_3$) gas and a gas including a compound containing indium to said substrate;

illuminating said silicon substrate with a lateral intensity patterning of ultraviolet (UV) light; and forming at least one indium nitride based nanostructure on said silicon substrate.

* * * * *